(12) United States Patent
Kajiyama (10) Patent No.: US 7,633,809 B2
(45) Date of Patent: Dec. 15, 2009

(54) SEMICONDUCTOR DEVICE

(75) Inventor: Shinya Kajiyama, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/602,342

(22) Filed: Nov. 21, 2006

(65) Prior Publication Data

US 2007/0121377 A1    May 31, 2007

(30) Foreign Application Priority Data

Nov. 21, 2005    (JP)    ............................. 2005-335861

(51) Int. Cl.
*G11C 11/34* (2006.01)
(52) U.S. Cl. .............................. 365/185.25; 365/185.24
(58) Field of Classification Search ............ 365/185.25, 365/185.24
See application file for complete search history.

(56) References Cited

U.S. PATENT DOCUMENTS

| | | | | |
|---|---|---|---|---|
| 4,162,539 A | * | 7/1979 | Hebenstreit | ................. 365/149 |
| 4,907,200 A | * | 3/1990 | Ikawa et al. | ............ 365/189.09 |
| 5,161,123 A | * | 11/1992 | Mochizuki | ................... 365/204 |
| 5,761,124 A | | 6/1998 | Sato et al. | |
| 6,421,289 B1 | * | 7/2002 | Lu et al. | ...................... 365/205 |
| 6,611,448 B2 | * | 8/2003 | Nair et al. | ................... 365/145 |
| 6,912,167 B2 | * | 6/2005 | Tam | ............................ 365/207 |
| 7,050,346 B2 | * | 5/2006 | Maejima et al. | ............. 365/207 |
| 2004/0042286 A1 | * | 3/2004 | Kato et al. | ................... 365/200 |
| 2004/0228170 A1 | * | 11/2004 | Brennan et al. | .............. 365/158 |
| 2006/0044903 A1 | * | 3/2006 | Forbes | ......................... 365/205 |

FOREIGN PATENT DOCUMENTS

JP    7-105693    11/1993

* cited by examiner

*Primary Examiner*—Michael T Tran
(74) *Attorney, Agent, or Firm*—Stites & Harbison PLLC; Juan Carlos A. Marquez, Esq.

(57) ABSTRACT

A semiconductor storage device in which a read sense circuit stable for the fluctuation in manufacturing process and environmental conditions can be realized and the read access time can be shortened is provided. A sense circuit for reading a memory cell characterized in that a flowing current is varied depending on stored data and a voltage applied through a word line includes: an inverter; a first capacitor provided so as to be electrically connected between an input of the inverter and a bit line to which the memory cell is connected; a first transistor which short-circuits an input and an output of the inverter; a second capacitor for supplying charge to the first capacitor; and second transistors, wherein an input potential of the inverter is increased or decreased according to the current of the memory cell and is then amplified to be latched as a logic value.

18 Claims, 10 Drawing Sheets

Vth distribution in 2 Vth level operation

FIG. 5B

Vth distribution in 4 Vth level operation

NAND gate type post amplifier enable

Programming operation

FIG. 10B

Read operation

SEMICONDUCTOR DEVICE

CROSS-REFERENCE TO RELATED APPLICATION

The present application claims priority from Japanese Patent Application No. JP 2005-335861 filed on Nov. 21, 2005, the content of which is hereby incorporated by reference into this application.

TECHNICAL FIELD OF THE INVENTION

The present invention relates to a non-volatile semiconductor storage device. More particularly, it relates to a technology effectively applied to a non-volatile semiconductor storage device using, as a memory cell, a current-type memory cell such as a floating-gate-type flash memory, a discrete-trap MONOS, a SONOS-type memory, a phase change memory, or an MRAM (magnetic random access memory), in which a resistance of the memory cell and a current flowing through the memory cell are changed depending on stored data.

BACKGROUND OF THE INVENTION

According to the study by the inventor of the present invention, for example, the following technology is known in a non-volatile semiconductor storage device (non-volatile semiconductor memory).

In the field of a non-volatile semiconductor memory, in particular, in a flash memory, the capacity has been increased by reducing a cell size, and the data capacity of an application has also been increased from image and music to moving pictures. Accordingly, reading and programming rates capable of reading and programming large-capacity data without stress have been desired.

As an example of an overhead time at the time of reading, a read $1^{st}$ access time is known. The read $1^{st}$ access time is a time from an input of a data read command to an output of data for the first time. It is essential for the increase of a reading rate to reduce this read $1^{st}$ access time. Of the read $1^{st}$ access time, a time of reading data from the memory cell by a sense circuit accounts for a considerable ratio of 20%. This is one of large problems in increasing a reading rate, together with a time for activating an internal power supply circuit and a time for data transfer from a sense circuit to SRAM.

Furthermore, in a multilevel flash memory, in order to program at an intended threshold level, a verify read operation in which data in the memory cell is read at the time of each programming is repeated. For this reason, an increase in a reading rate is also essential for the achievement of an increase in a programming rate.

Figure 11:
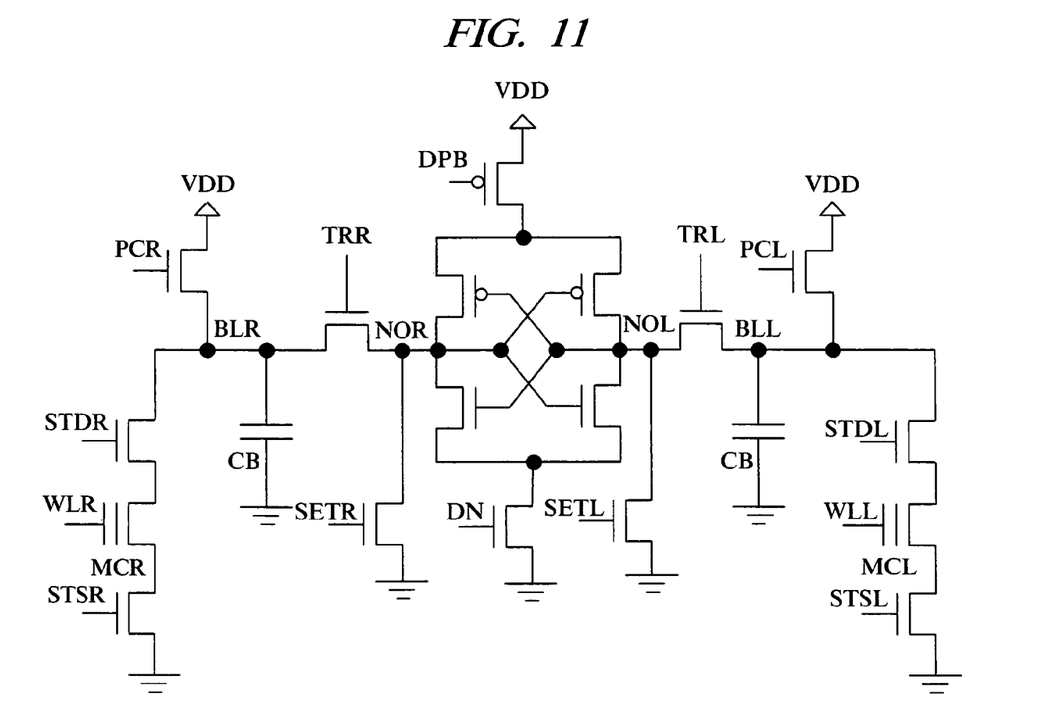
FIG. 11 is a circuit diagram showing one example of a sense circuit studied as a background of the present invention.
Figure 12:
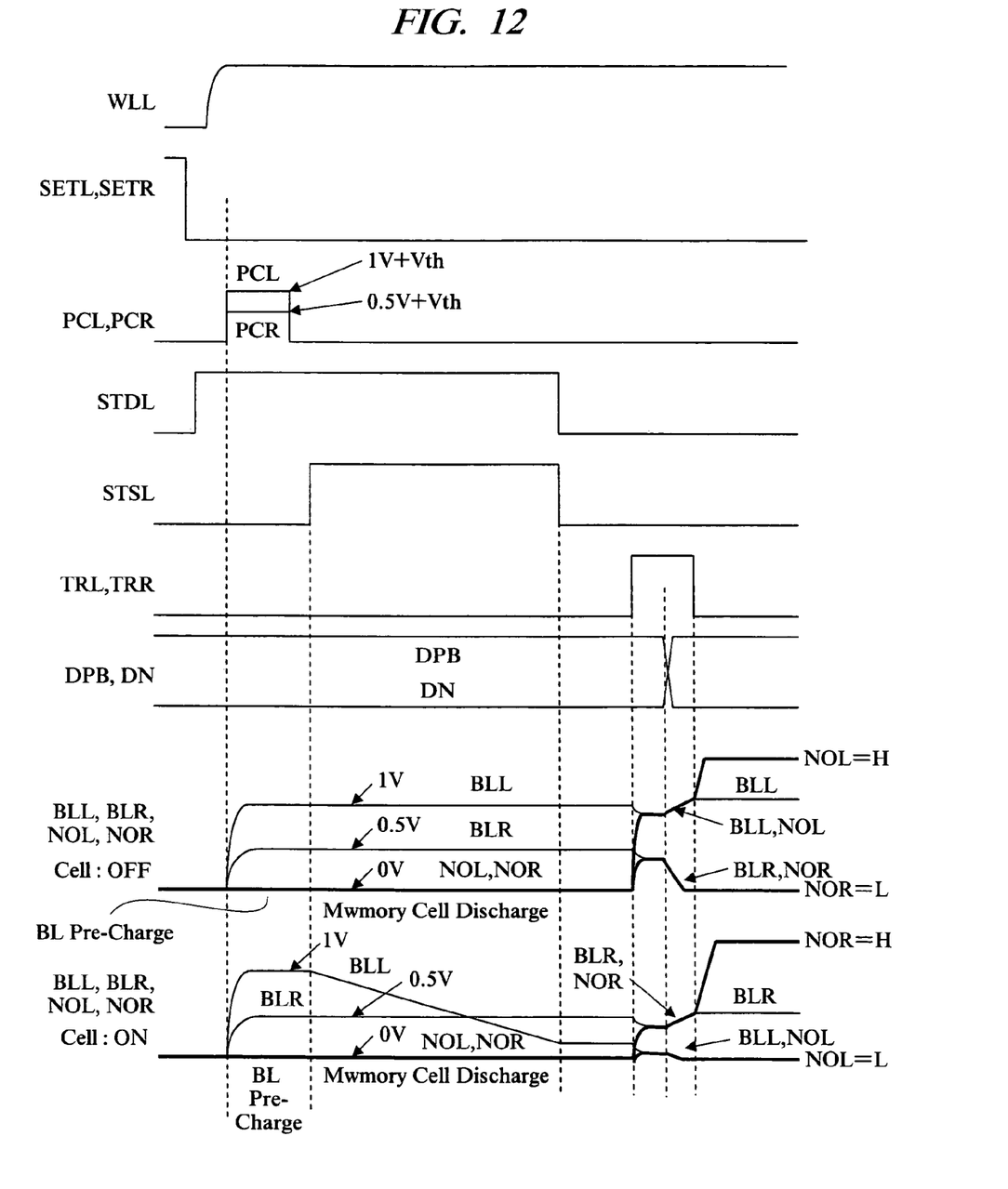
FIG. 12 is a timing chart showing the operation of the sense circuit of FIG. 11.

As a sense circuit of a flash memory, a circuit as shown in FIG. 11 is proposed in Japanese Patent Application Laid-Open Publication No. 7-105693 (Patent Document 1). Note that FIG. 11 is a drawing obtained by redrawing FIG. 1 and FIG. 2 of the Patent Document 1 from the inventor's point of view. FIG. 12 is a timing chart for describing the operation of the circuit of FIG. 11.

SUMMARY OF THE INVENTION

Incidentally, as a result of the study by the inventor for the technology regarding a sense circuit of a flash memory as described above, the following has been revealed.

The read operation in the sense circuit of FIG. 11 studied as a background of the present invention will be described below. FIG. 12 is a timing chart of the read operation.

First, an X address is selected through a word line WLL. A memory cell MCL on the right of FIG. 11 is a selected memory cell and is connected to a sense circuit via a bit line BLL. A memory cell MCR on the left of FIG. 11 is an unselected memory cell and is connected to the sense circuit via a bit line BLR. The potential of the bit line BLR of the unselected memory cell is used as a reference voltage for the comparison with the potential of the bit line BLL of the selected memory cell. The sense circuit is a latch-type circuit in which CMOS inverters are cross-coupled.

As shown in FIG. 12, firstly, SETL and SETR are set at H (high), and input/output nodes NOL and NOR of the sense circuit are set at 0V. STDL is raised to connect the drain of the selected memory cell MCL to the bit line BLL, and the selected word line WLL is raised to a predetermined potential. Then, PCL and PCR are raised to 1V+Vth and 0.5V+Vth, respectively. At this time, the potentials of the bit lines BLL and BLR fall by Vth to be at 1V and 0.5V, respectively. After PCL and PCR are fallen to cause the bit lines BLL and BLR to be in a high impedance state, STSL is raised to an H level. At this time, depending on the stored data in the memory cell MCL, that is, depending on whether the memory cell is in an ON state or an OFF state, it is determined whether a discharge from the bit line BLL occurs. When the memory cell is in an ON state, the selected memory cell MCL draws a charge from a parasitic capacitance CB of the bit line BLL. Therefore, the potential of the bit line BLL is decreased with time. On the other hand, when the selected memory cell in an OFF state, only a leakage current flows. Therefore, a decrease in potential of the bit line BLL is slow.

STDL and STSL are fallen to end a memory cell discharge, and TRL and TRR are raised to an H level. At this time, the charge is shared between the bit lines BLL and BLR and the input/output nodes NOL and NOR of the sense circuit, the potentials of the bit line BLL and the input/output node NOL of the sense circuit are equalized and the potentials of the bit line BLR and the input/output node NOR are equalized.

When DPB and DN are switched from H to L (low) and from L to H, respectively, the sense circuit is enabled, thereby starting amplification of the input/output nodes NOL and NOR of the sense circuit. When the selected memory cell MCL is in an OFF state, the relation in potential after the memory cell discharge is BLL>BLR. Therefore, with this amplification, the potentials of the bit line BLL and the input/output node NOL of the sense circuit are increased, and the potentials of the bit line BLR and the input/output node NOR of the sense circuit are decreased. On the other hand, when the selected memory cell is in an ON state, the relation in potential after the memory cell discharge is BLL<BLR. Therefore, with this amplification, the potentials of the bit line BLR and the input/output node NOR of the sense circuit are increased, and the potentials of the bit line BLL and the input/output node NOL of the sense circuit are decreased.

Then, TRL and TRR are decreased to L to separate the bit lines BLL and BLR from the input/output nodes NOL and NOR of the sense circuit. Thereafter, the sense circuit does not have to drive the large parasitic capacitance CB of the bit lines BLL and BLR. Therefore, the potentials of the input/output nodes NOL and NOR of the sense circuit are rapidly changed to a logic H/L level, and the data in the memory cell are determined.

The foregoing is the read operation of the sense circuit studied as a background of the present invention. However, it is required for the determination of the data to ensure a memory discharge time where the bit line BLL of the selected memory cell is decreased from 1V and it becomes lower than a reference voltage of 0.5V of the unselected bit line BLR, and therefore a shift in bit-line potential of 0.5V is required for the determination. If the reference voltage of the bit line BLR is increased to, for example, about 0.9 V in order to reduce the discharge time, sensitivity to off leakage of the unselected cell and offset voltage due to a mismatch of transistors forming the sense circuit is increased, which leads to an erroneous determination. For this reason, it is necessary to set the reference voltage at an intermediate potential of a read amplitude with a margin, and a shift in bit-line potential equal to or larger than 0.5 V is essentially required.

Moreover, with further increase in capacity and further microfabrication of the cell size, the space between bit lines has been narrowed and the parasitic capacitance CB of the bit line has been increased. On the other hand, an ON-cell discharge current at the time of reading tends to be kept the same or decreased even with further microfabrication, in view of reduction in power consumption. Therefore, as the generation advances, the decreasing rate of the potential of the bit line is decreased. In order to obtain the same shift in bit-line potential, a long time has to be ensured for the time from the start of discharge to the determination. More specifically, the reading tends to be slower in newer generations.

In the above, the flash memory has been described as an example. However, the above-described problem is not restricted to the flash memory, but the same goes for other memories in which a rate at which the potential of the bit line is discharged is detected or a value of a current flowing through the bit line is detected to distinguish "1" or "0". That is, as the microfabrication advances, a similar problem occurs in a non-volatile semiconductor storage device using a current-type memory cell such as a discrete-trap MONOS, a SONOS-type memory, a phase change memory, or an MRAM (magnetic random access memory), in which a resistance of the memory cell and a current flowing through the memory cell are changed depending on stored data.

For the solution of the above-described problem, the inventor has noticed the importance of a sense circuit capable of determining the data in the memory cell even with a slight shift in bit-line potential. Furthermore, the inventor has devised a circuit capable of not only performing the determination with a slight shift in bit-line potential but also reducing an influence of manufacturing process variation and fluctuation in operation environmental temperature on a threshold for determining data in the memory cell, that is, magnitude of a discharge current of the selected cell, thereby stably determining the threshold based on a ratio between two capacitances and a clock frequency.

The typical ones of the inventions disclosed in this application will be briefly described as follows.

More specifically, in the semiconductor device according to the present invention, a sense circuit for reading a non-volatile memory cell characterized in that a flowing current is varied depending on stored data and a voltage applied through a word line includes: an inverting amplifier; a first capacitor provided so as to be electrically connected between an input of the inverting amplifier and a bit line to which the memory cell is connected; a first switch short-circuiting an input and an output of the inverting amplifier; and a charging circuit for supplying charge to the first capacitor. For the charging circuit, for example, a switched capacitor circuit including a second capacitor and a second switch, a current source, or a resistor element is used.

The effects obtained by typical aspects of the present invention will be briefly described below. That is, a read access time can be reduced.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Figure 1:
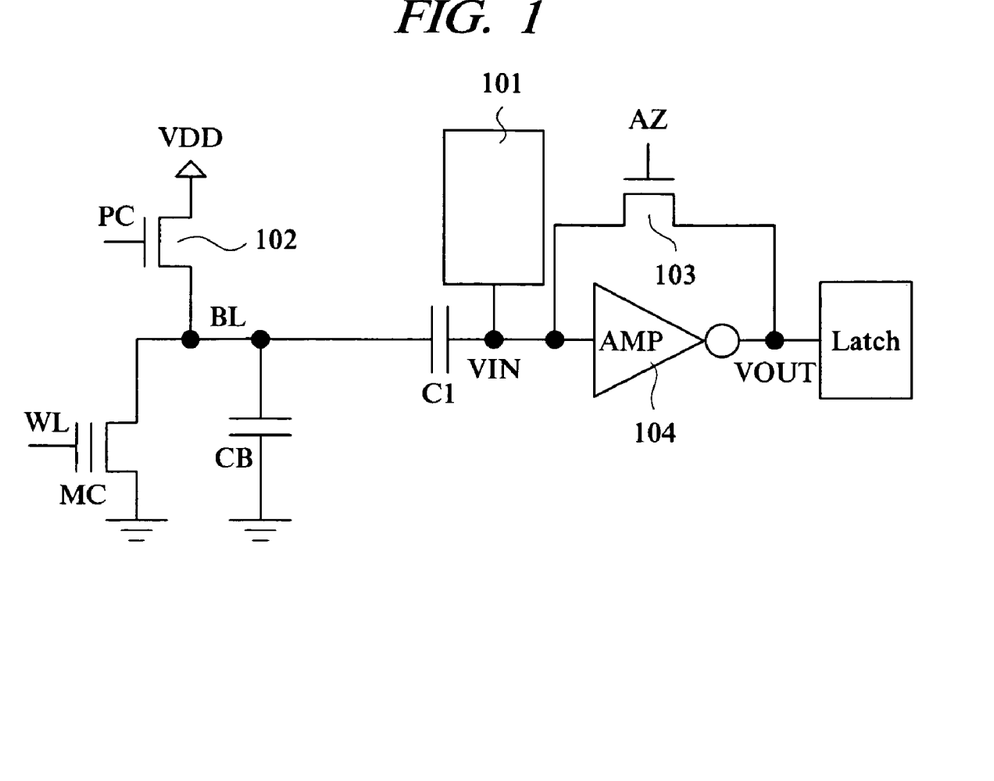
FIG. 1 is a circuit diagram showing the configuration of a read sense circuit in a non-volatile semiconductor storage device according to one embodiment of the present invention.

FIG. 1 is a circuit diagram showing the configuration of a read sense circuit in a non-volatile semiconductor storage device according to one embodiment of the present invention.

First, an example of the configuration of the non-volatile semiconductor storage device according to this embodiment will be described with reference to FIG. 1. The non-volatile semiconductor storage device according to this embodiment is, for example, a flash memory, and it includes a non-volatile memory cell MC, a bit line BL connected to the memory cell MC, a capacitor C1 (first capacitor) with one end connected to the bit line BL, an inverter 104 (inverting amplifier AMP) with another end of the capacitor C1 as an input, a charging circuit 101 connected to the other end of the capacitor C1, a pre-charge transistor 102 connected to the bit line BL, a transistor 103 (first switch) short-circuiting an input and an output of the inverter 104, a latch connected to the output of the inverter 104, and others.

In order to minimize a through current at the time of short-circuiting the input and output of the inverter 104, for example, a clocked circuit input or the like is used for the latch.

Figure 2:
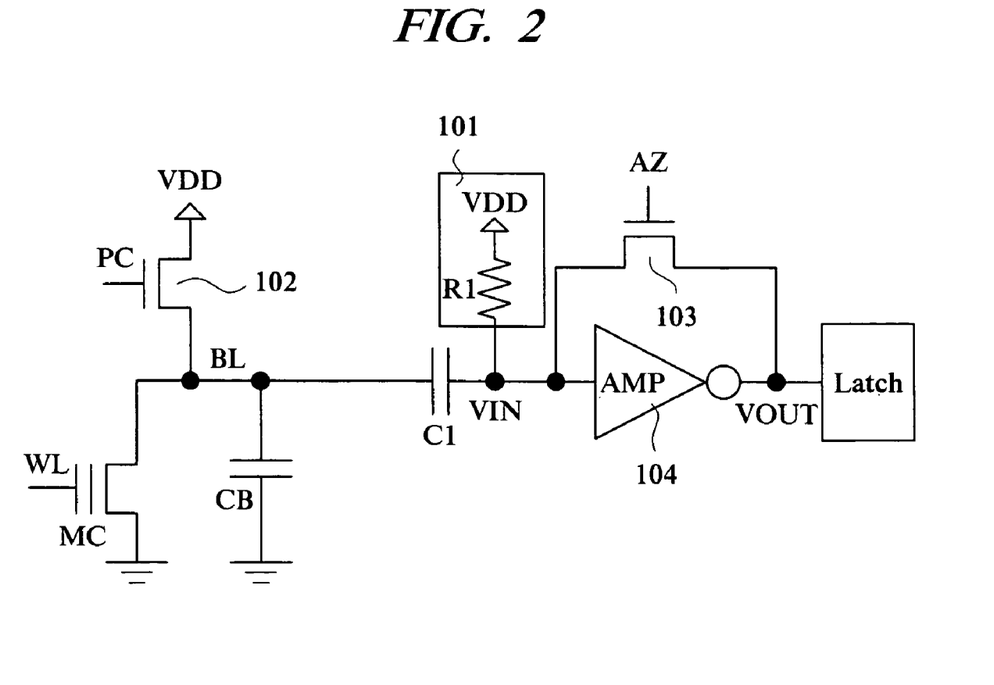
FIG. 2 is a circuit diagram showing a specific configuration of a read sense circuit in the non-volatile semiconductor storage device according to one embodiment of the present invention.

FIG. 2 shows a specific configuration of the read sense circuit.

The charging circuit 101 is used to supply charge to the capacitor C1, and a current source can be used for it. Also, as shown in FIG. 2, a resistor R1 with one end connected to the other end of the capacitor C1 and the other end connected to a power supply VDD (first power supply) can be used. In the circuit of FIG. 2, by using a polycrystalline silicon resistor, a MOSFET resistor, or a diffusion layer resistor as the resistor R1, the need of complex circuitry or a clock can be eliminated and power consumption can be reduced.

In FIG. 1 and FIG. 2, the selected memory cell is represented as MC and is selected through a word line WL. In the case of a flash memory, a voltage is applied to the word line WL by a word driver circuit. At this time, depending on whether a current equal to or larger than a predetermined current of, for example, 100 nA flows through the memory cell MC, it is determined whether the threshold voltage of the memory cell MC is higher or lower than a WL voltage, and the threshold of the memory cell MC represents stored data in the memory cell MC. Incidentally, in the case of a flash memory, programming is performed by injecting electrons into a floating gate of the memory cell MC, and as more electrons are injected, the potential of the floating gate is decreased. Therefore, the threshold voltage of the memory cell viewed from the word line WL is increased. Note that the capacitance CB is a parasitic capacitance of the bit line BL.

With this sense circuit, the determination can be performed with even a subtle voltage swing of the bit line. Therefore, it is possible to significantly reduce the memory cell discharge time as ever before.

Figure 3:
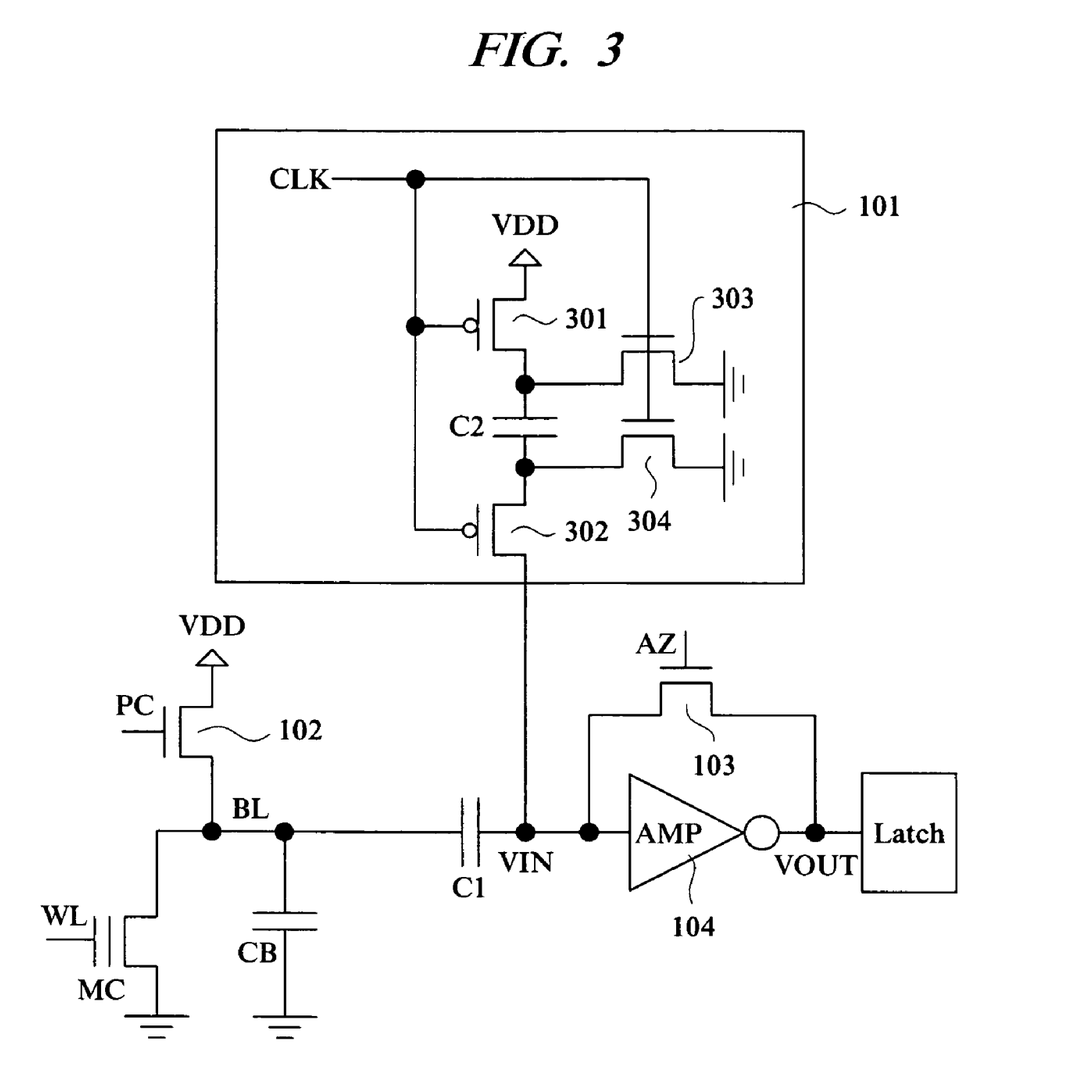
FIG. 3 is a circuit diagram showing another specific configuration of a read sense circuit in the non-volatile semiconductor storage device according to one embodiment of the present invention.

FIG. 3 shown another specific configuration of the read sense circuit.

In the sense circuit shown in FIG. 3, the charging circuit 101 shown in FIG. 1 is configured of a switched capacitor circuit formed of a capacitor C2 (second capacitor) and transistors 301 to 304 (second switches). An input of a clock CLK is inputted to this switched capacitor circuit, and a transfer charge amount per unit time is controlled with the frequency thereof.

Figure 4:
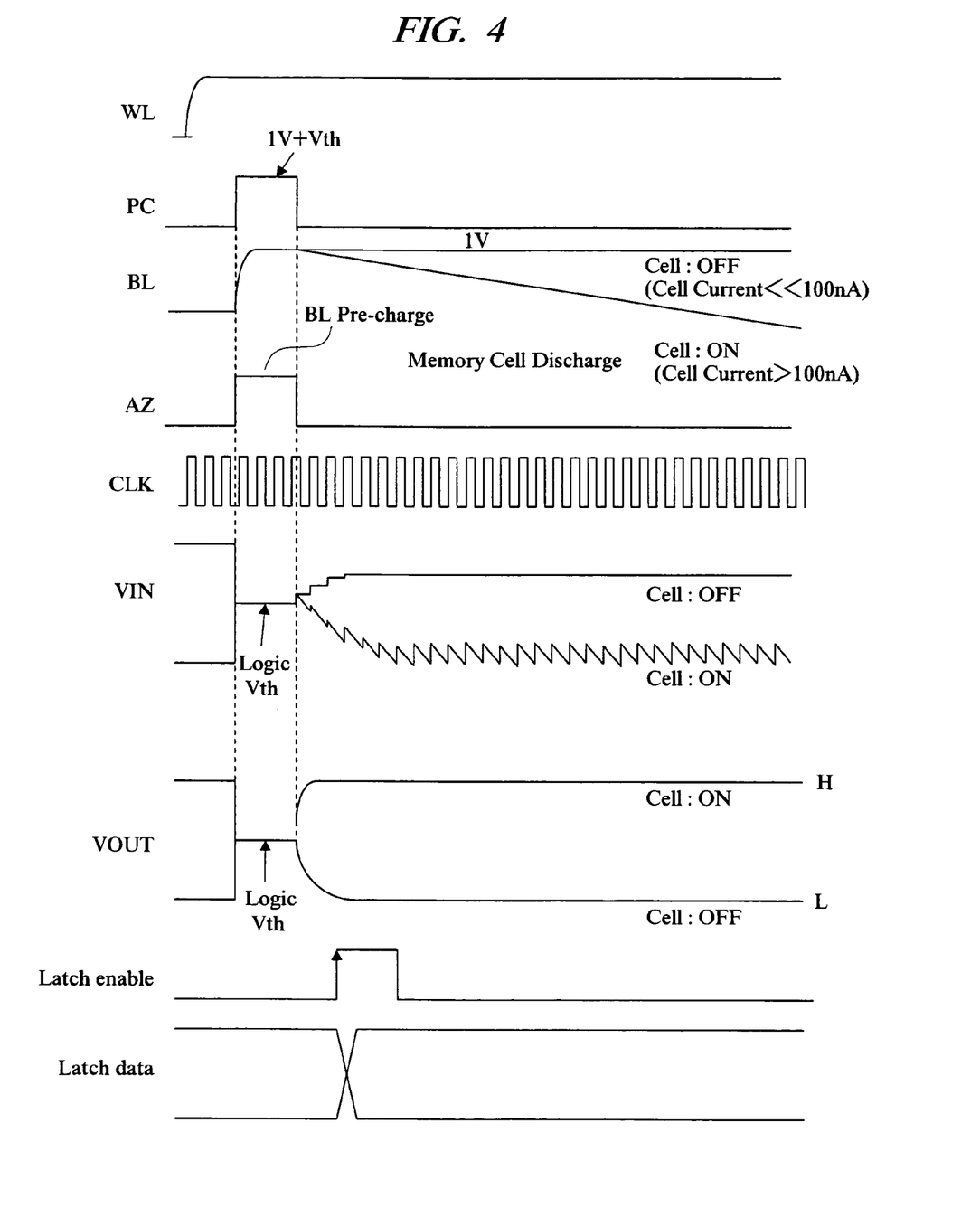
FIG. 4 is a timing chart showing the operation of the read sense circuit of FIG. 3.

FIG. 4 shows a timing chart of a read operation by the sense circuit shown in FIG. 3. To perform a read operation, an X address of a cell to be read is selected. A potential of about −2V is applied to an unselected word line WL, and a predetermined WL potential is applied to a selected cell.

Figure 5A:
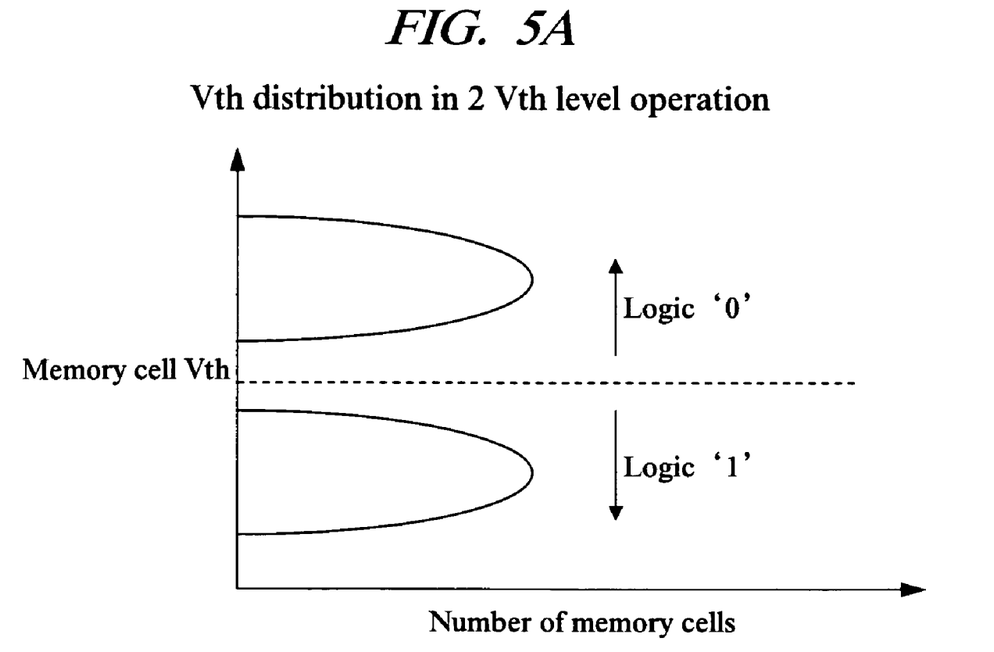
FIG. 5A is a drawing showing a threshold (Vth) distribution in 2 Vth level operation in an AG-AND-type flash memory in the non-volatile semiconductor storage device according to one embodiment of the present invention.
Figure 5B:
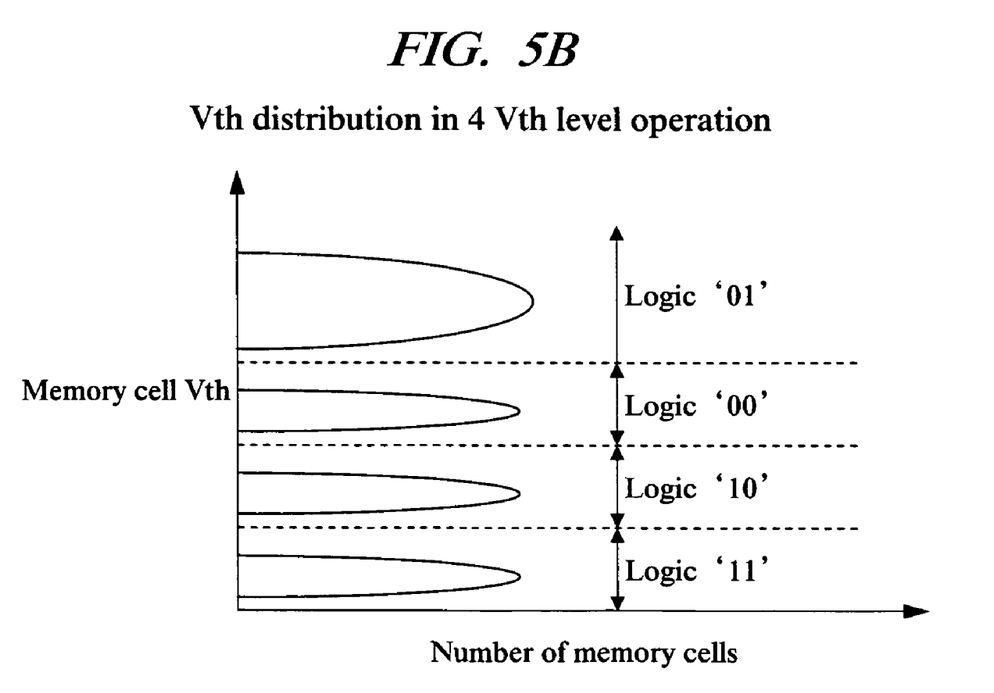
FIG. 5B is a drawing showing a threshold (Vth) distribution in 4 Vth level operation in the AG-AND-type flash memory in the non-volatile semiconductor storage device according to one embodiment of the present invention.

FIG. 5A and FIG. 5B each show a threshold (Vth) distribution of an AG-AND-type flash memory.

In the case of a flash memory, as shown in FIG. 5A, in the 2 Vth level operation where 1-bit data is stored in one cell, an intermediate level between logic 1, that is, a threshold in a deletion state and logic 0, that is, a threshold in a programmed state is applied to the word line WL. As shown in FIG. 5B, in the 4 Vth level operation where 2-bit data is stored in one cell, three intermediate levels such as an intermediate level between a threshold at the lowest level, that is, the "11" level and a threshold at the second-lowest level, that is, the "10" level; an intermediate level between the threshold at the "10" level and a threshold at the third-lowest level, that is, a "00" level; and an intermediate level between the threshold at the "00" level and a threshold at the highest level, that is, a "01" level are applied, and a logic level to which the threshold voltage of the selected cell corresponds is determined through the three read operations.

As shown in FIG. 4, an X address is selected through the word line WL, and a pre-charge signal PC is increased to 1V+Vth to pre-charge the bit line BL to 1V. Vth represents a threshold voltage of the NMOS transistor 102 whose gate receives the pre-charge signal PC. At the same time, a signal AZ is set at H (high level) to short-circuit the input and the output of the inverting amplifier AMP, thereby causing the inverting amplifier AMP to be in a stable state with a high gain. Note that the pre-charge signal PC may be raised before the signal AZ. Also, the timing of raising the signal AZ to H is after the word line WL is raised. While the signal AZ is at H, a through current flows into the inverter 104, and therefore, it is preferable that a period during which the signal AZ is at H is set as short as possible.

When a CMOS logic inverter is used as the inverting amplifier AMP, the input and output of the inverter are short-circuited. Therefore, the input/output node potential serves as a logic threshold. A difference in potential between the pre-charge level of 1 V of the bit line BL and the logic threshold of the inverter is stored in the capacitor C1 as a charge.

Next, the pre-charge signal PC and the signal AZ are decreased to L (low level) to start the discharge of the selected memory cell MC, and at the same time, the inverter 104 is enabled to perform an amplifying operation. At this time, the NMOS transistors 303 and 304 and the PMOS transistors 301 and 302 connected to the capacitor C2 are periodically turned ON/OFF by the clock CLK. With the switched capacitor formed of the NMOS and PMOS switches (transistors 301 to 304) connected to the capacitor C2 and the capacitor C2, the following charge transfer occurs.

That is, in a phase of the clock CLK=L, a potential corresponding to a difference in potential between VIN and the power supply VDD is transferred from the capacitor C2 to the capacitor C1. In a phase of the clock CLK=H, the charge stored in the capacitor C2 is discharged. By repeating this cycle, charge is stored in the capacitor C1, and the potential of VIN is to be increased.

On the other hand, depending on the stored data of the selected memory cell, the memory cell discharge current is varied. When the threshold of the selected memory cell MC is lower than the WL potential, the charge of the parasitic capacitance CB of the pre-charged bit line is discharged, and a decrease in BL potential occurs. By this means, the decrease in BL potential is transferred to VIN through the capacitor C1.

That is, the operation of decreasing VIN from the bit line BL through the capacitor C1 and the operation of increasing VIN through the transfer of charge to the capacitor C1 by the switched capacitor are simultaneously performed. Depending on a balance therebetween, whether the VIN potential is higher or lower than the logic threshold set by short-circuit at AZ=H is determined.

Here, the switched capacitor formed of the capacitor C2 and the NMOS transistors 303 and 304 and the PMOS transistors 301 and 302 connected to the capacitor C2 can be regarded as an equivalent resistor which supplies a current according to the difference in potential between both ends of the capacitor C2, and this resistance R can be represented as:

$$R=1/(C2 \cdot f_{CLK})$$

where $f_{CLK}$ is a frequency of the clock CLK. Also, it can be thought that a high-pass filter formed of the above-described resistor R and capacitor C1 is inserted at the former stage of the inverting amplifier, and a cut-off frequency fc of this high-pass filer is:

$$fc=1/(2\pi \cdot R \cdot C1)=C2 \cdot f_{CLK}/(2\pi \cdot C1),$$

and the cut-off frequency fc is determined based on a ratio between the capacitor C2 and the capacitor C1 and the clock frequency. More specifically, VIN is decreased when the frequency of a decrease in the potential of the bit line BL determined based on the discharge current of the memory cell and the parasitic capacitance CB of the bit line is higher than the cut-off frequency fc, and VIN is increased when the frequency is lower than the cut-off frequency fc. Therefore, if the parasitic capacitance CB of the bit line is known, the capacitors C1 and C2 and the clock frequency $f_{CLK}$ can be designed so that logic 1 is determined when the current is larger than a discharge current of, for example, 100 nA and logic 0 is determined when the current is smaller than the discharge current of 100 nA. For example, if design specifications are assumed to be such that a determination is made with a discharge current of 100 nA, CB=700 fF, and the frequency $f_{CLK}$ of the clock CLK is 2.5 MHz, the above can be achieved with C1=200 fF and C2=25 fF.

At this time, the inverting amplifier operates at the logic threshold and has a high gain. Therefore, if VIN is slightly decreased, H is outputted to VOUT, and if VIN is slightly increased, L is outputted to VOUT. By enabling the latch at an appropriate timing when VOUT is amplified to a logic amplitude, the threshold of the selected memory cell can be taken into the latch as logic data. The timing of enabling the latch is after the signal AZ is set at L and then VOUT is determined.

Although it depends on the gain of the inverting amplifier, a determination can be made even with a bit line voltage swing of about 0.1V. Therefore, it is possible to reduce the memory cell discharge time to one fifth or lower than that in the conventional art.

Also, if a clock having a known stable frequency can be inputted from the outside, since C2/C1 is a ratio of capacitances, it is resistant to an influence of process variation and environmental fluctuation, and it is possible to obtain a stable cut-off frequency fc. Therefore, with this embodiment, a read operation stable for the process variation and environmental fluctuation can be achieved. For example, even when the temperature at the time of program-verify reading differs from the temperature at the time of reading to the outside of the chip, a stable read operation can be performed with the same determination conditions.

The capacitors C1 and C2 of FIG. 3 can be integrated on an LSI by using MOS capacitors or Metal-Insulator-Metal capacitors. If a high-density capacitors can be used, the chip area can be reduced. Note that, since the logic threshold varies for each sense circuit, the voltage applied to the capacitor C1 also varies for each sense circuit. For this reason, depletion MOS capacitors with a small bias-voltage dependency or Metal-Insulator-Metal capacitors are preferably used for the capacitors C1 and C2.

The sense circuit according to this embodiment can be applied not only to a flash memory but also to any semiconductor memories having a current-type memory cell such as a phase-change memory and a magnetic random access memory (MRAM), in which the current of the cell is changed depending on data stored in the cell.

Figure 6:
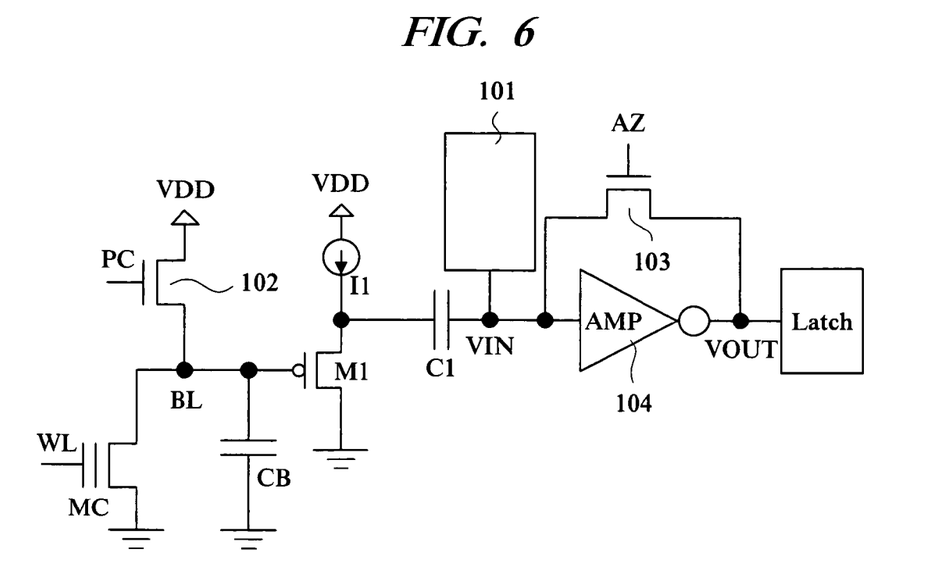
FIG. 6 is a circuit diagram showing the configuration of another read sense circuit in the non-volatile semiconductor storage device according to one embodiment of the present invention.

FIG. 6 shows another example of the configuration of the read sense circuit. In this sense circuit, a source-follower buffer formed of a transistor M1 and a current source I1 is inserted between the bit line BL and the capacitor C1. This embodiment has an advantage that switching noise of the clock CLK is less prone to be transferred to the memory cell array side. Furthermore, since the memory cell does not draw the charge from the capacitor C1, such an advantage can be obtained that a decrease in voltage of the bit line BL is faster compared with FIG. 1 and a discharge time can be reduced.

Figure 7:
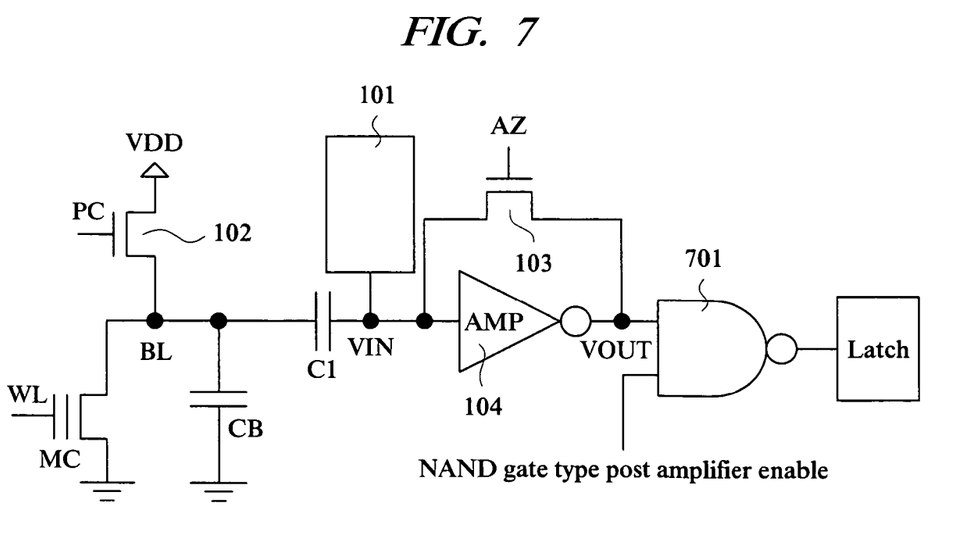
FIG. 7 is a circuit diagram showing the configuration of still another read sense circuit in the non-volatile semiconductor storage device according to one embodiment of the present invention.

FIG. 7 shows still another example of the configuration of the read sense circuit. In this sense circuit, an amplifier is further inserted at the posterior stage of the inverting amplifier AMP (inverter 104) of FIG. 1 to increase gain. When a CMOS inverter is used as the inverting amplifier at the first stage and a CMOS NAND gate 701 is used as the inverting amplifier at the posterior stage, if L is inputted to a post amplifier enable input of the NAND gate 701 while the transistor 103 is in an ON state, the through current flows only through the inverter at the first stage. Therefore, it is possible to suppress the power consumption. By setting the post amplifier enable input of the NAND gate 701 at H after the end of the precharge of the bit line BL and the start of the memory cell discharge, a high gain can be achieved, and a faster determination can be advantageously performed.

Figure 8:
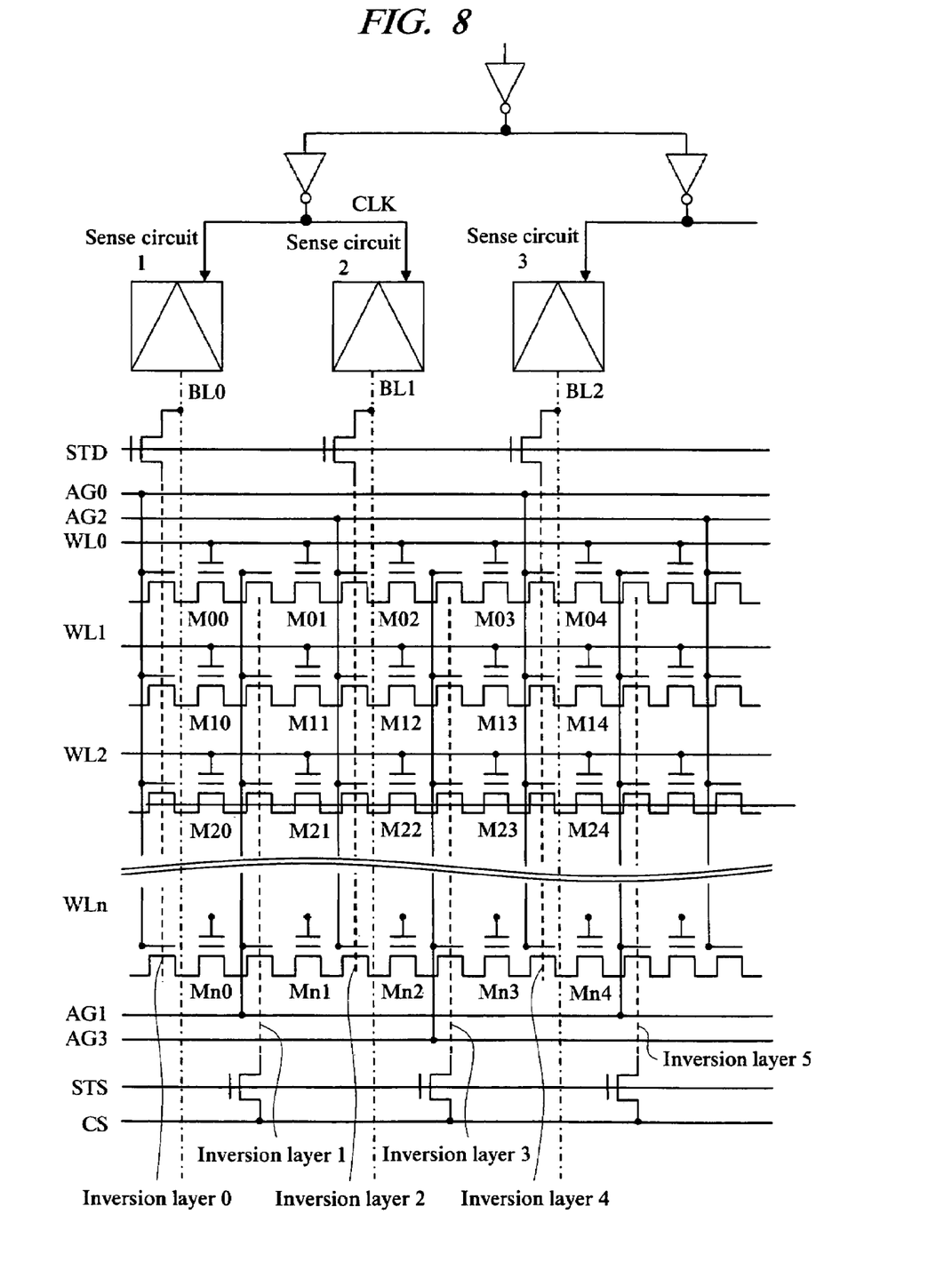
FIG. 8 is a circuit diagram showing the memory array configuration of an AG-AND-type flash memory in the non-volatile semiconductor storage device according to one embodiment of the present invention.

FIG. 8 shows an example of the configuration of a memory array of an AG-AND type flash memory to which the present invention is applied. In FIG. 8, M00 to Mn4 are assumed to be memory cells with word lines WL0 to WLn as control gates and having floating gates. An AG-MOS with an assist gate AG as a gate is disposed each between the memory cells. Inversion layers formed by applying a voltage to the assist gates AG are used as local bit lines and serve as source or drain wires for each memory cell. The local bit lines are connected to global bit lines BL0 to BL2 and a common source CS via switch NMOS transistors whose gates receive STS. Sense circuits are connected to the global bit lines BL0 to BL2 and read the data in a memory cell selected through a word line WLn. Note that, since the clock CLK for use in the switched capacitor has to be distributed to all sense circuits, fan-out of a clock buffer is increased, and there is a concern that a clock is not transferred. In this case, by adopting a clock tree configuration as shown in FIG. 8, the fan-out of the clock buffer can be reduced.

Figure 9:
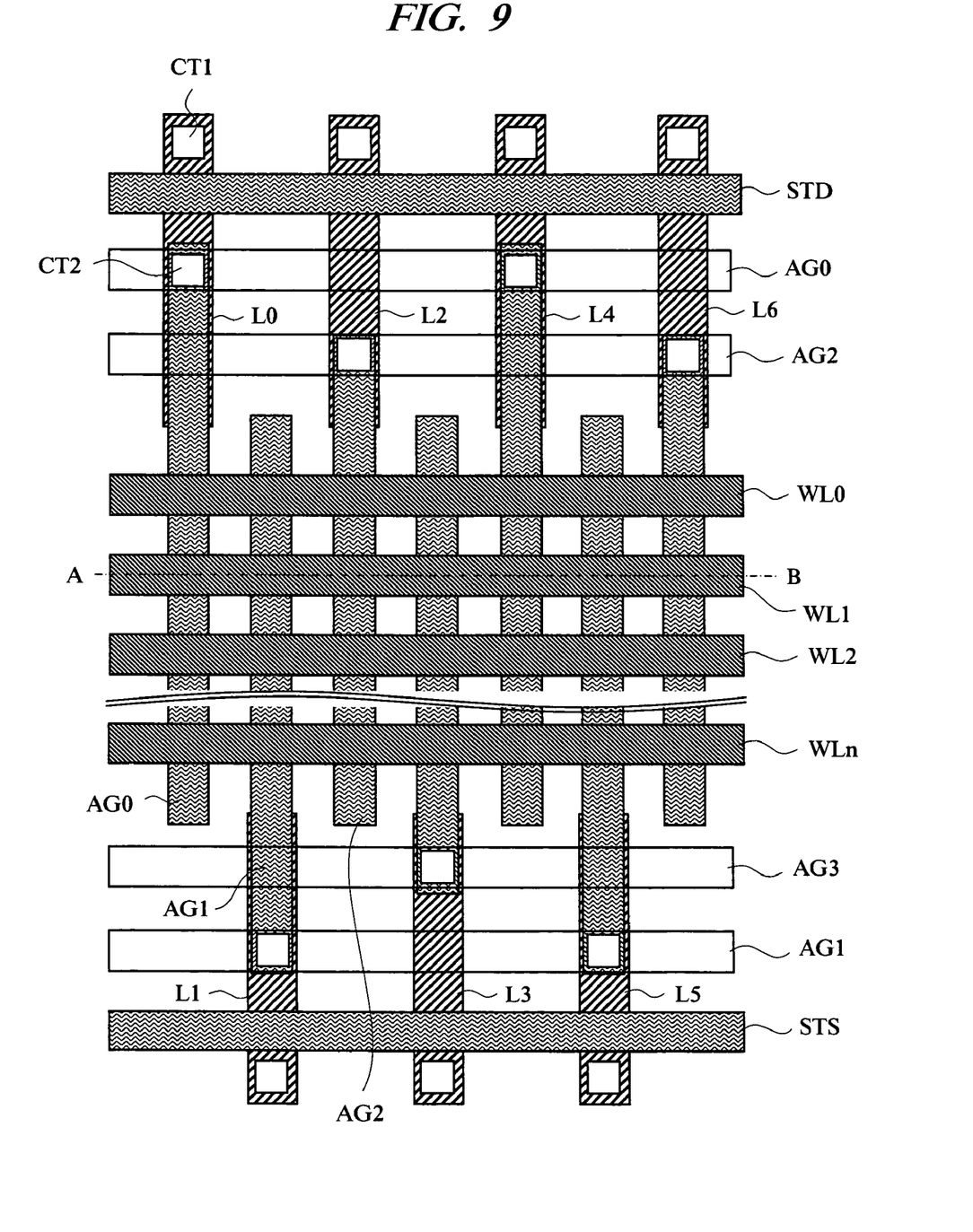
FIG. 9 is a top view of the memory array configuration of the AG-AND-type flash memory in the non-volatile semiconductor storage device according to one embodiment of the present invention.

FIG. 9 shows a top view of an example of memory array configuration of the AG-AND-type flash memory to which the present invention is applied. The inversion layers under the assist gates AG are connected to metal wires via diffusion layer wires L0 to L6 and contacts CT1 and others. Although not shown, a floating gate is disposed between assist gates and under a word line.

Figure 10A:
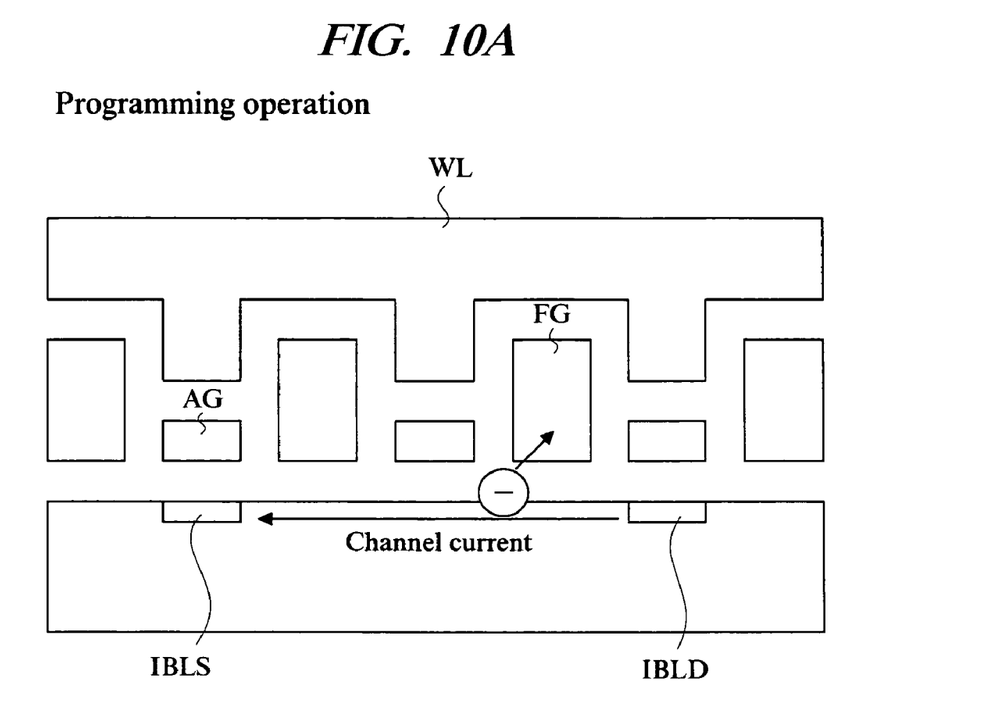
FIG. 10A is a cross-section of the memory array configuration of the AG-AND-type flash memory at the time of programming in the non-volatile semiconductor storage device according to one embodiment of the present invention.
Figure 10B:
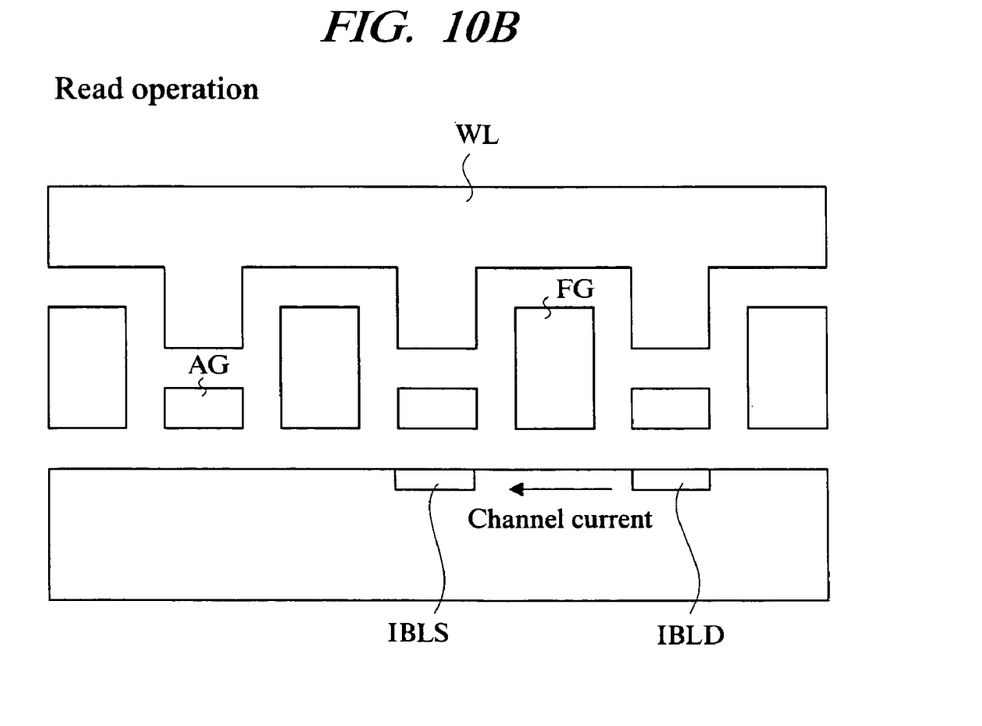
FIG. 10B is a cross-section of the memory array configuration of the AG-AND-type flash memory at the time of reading in the non-volatile semiconductor storage device according to one embodiment of the present invention.

FIG. 10A and FIG. 10B show cross-sections of the example of memory array configuration of the AG-AND-type flash memory to which the present invention is applied. FIG. 10A and FIG. 10B show the cross-sections taken along a line A-B in FIG. 9. At the time of programming, as shown in FIG. 10A, a voltage of 15V is applied to the selected word line WL, and an inversion layer formed when a voltage is applied to the assist gate AG is used as a local bit line. By applying 4.5V to an inversion-layer bit-line drain IBLD and 0V to an inversion-layer bit-line source IBLS and accelerating electrons by an electric field between the source and the drain, hot electrons are generated. Of these hot electrons, those going beyond an energy barrier of silicon oxide under the floating gate FG are drawn by a vertical electric field and then injected to the floating gate FG.

As shown in FIG. 10B, also at the time of reading, an inversion-layer bit line is formed, and the inversion-layer bit-line drain IBLD is pre-charged to 1V and 0V is applied to the inversion-layer bit-line source IBLS. Through the above-described sense circuit operation, whether the threshold voltage of the cell is higher or lower than the voltage of the selected word line is read.

Therefore, according to the non-volatile semiconductor storage device in the embodiments of the present invention, even when a shift in potential of the bit line is small, the data in the selected memory cell can be determined, and therefore, the reduction in a read time can be achieved.

Also, by using the above-described sense circuit, a determination threshold stable for the process variation and operation environmental temperature can be achieved. Therefore, even when the temperature of a read operation in the program verify differs from the temperature at the time of reading data to the outside of the chip, the data in the memory cell can be stably read.

In the foregoing, the invention made by the inventor of the present invention has been concretely described based on the embodiments. However, it is needless to say that the present invention is not limited to the foregoing embodiments and various modifications and alterations can be made within the scope of the present invention.

For example, in the above-described embodiments, the case where charge is supplied from the power supply VDD to the capacitor C1 via the resistor R1 or the capacitor C2 has been described. This is not meant to be restrictive. For example, charge may be drawn from a ground GND instead of the power supply VDD. In this case, pre-charge and discharge of the bit line BL is reversed to those in the above-described embodiments.

The present invention can be used in manufacturing industries of semiconductor devices, electronic equipment, and others.

What is claimed is:

1. A semiconductor device comprising:
   a memory cell;
   a bit line connected to said memory cell;
   a first capacitor having a first node and a second node, said first node being connected to said bit line;
   an amplifier having an input node connected to the second node of the first capacitor; and
   a charging circuit connected to the second node of said first capacitor and a power supply, said charging circuit supplying charge to said first capacitor from the power supply,
   wherein said amplifier comprises an inverter.

2. The semiconductor device according to claim 1, further comprising a first switch which short-circuits an input and an output of said inverter.

3. The semiconductor device according to claim 1, wherein said charging circuit comprises a current source.

4. The semiconductor device according to claim 1, wherein said charging circuit comprises a resistor with one end connected to the other end of said first capacitor and the other end connected to said power supply.

5. The semiconductor device according to claim 1, wherein said charging circuit comprises a switched capacitor circuit including a second capacitor and a second switch.

6. A semiconductor device comprising:
   a memory cell;
   a bit line connected to said memory cell;
   a pre-charge circuit connected to said bit line;
   a capacitor with one end connected to said bit line;
   a charging circuit connected to the other end of said capacitor and a power supply, said charging circuit supplying charge to the other end of said capacitor from the power supply;
   an inverter using the other end of said capacitor as an input; and
   a first switch which short-circuits an input and an output of said inverter,
   wherein, at the time of an operation of reading data in said memory cell, said bit line is pre-charged by said pre-charge circuit, and the input and the output of said inverter are short-circuited by said first switch.

7. The semiconductor device according to claim 6, wherein said charging circuit comprises a current source.

8. The semiconductor device according to claim 6, wherein said charging circuit has one end connected to the other end of said capacitor and the other end connected to said power supply.

9. The semiconductor device according to claim 6, wherein said charging circuit comprises a switched capacitor circuit including a second capacitor and a second switch.

10. The semiconductor device according to claim 6, further comprising a post amplifier connected to an output of said inverter.

11. The semiconductor device according to claim 6, wherein the memory cell is a non-volatile memory cell.

12. A semiconductor device comprising:
    a plurality of word lines corresponding to X addresses;
    a plurality of bit lines corresponding to Y addresses;
    a plurality of memory cells connected to said word lines and said bit lines and storing data; and
    a plurality of sense circuits connected to said bit lines and reading the data in the memory cells connected to said bit lines and selected word lines,
    wherein, a current flowing on the bit lines through the memory cells is varied depending on stored data in said memory cell and a voltage applied through said word line,
    each of said sense circuits for reading includes:
    an inverting amplifier;
    a first capacitor having a first node connected to one of the bit lines and a second node connected to an input of said inverting amplifier;
    a first switch which short-circuits an input and an output of said inverting amplifier; and
    a charging circuit for supplying charge to said first capacitor.

13. The semiconductor device according to claim 12, wherein, after said word lines is selected and said bit line is pre-charged to a predetermined voltage, said bit line is set in a floating state, a decrease in potential of the bit line is sensed by said sense circuit, and the data stored in said memory cell is read.

14. The semiconductor device according to claim 13, wherein the input and the output of said inverting amplifier are short-circuited during a pre-charge period of said bit line, and a difference between an input/output potential of said inverting amplifier and a pre-charge potential of said bit line is stored in said first capacitor.

15. The semiconductor device according to claim 12,
wherein said charging circuit comprises a switched capacitor circuit including a second capacitor and a second switch, and with said switched capacitor circuit, a charge of said second capacitor is transferred to said first capacitor in synchronization with a clock, and an input potential of said inverting amplifier is increased.

16. The semiconductor device according to claim 12,
wherein said charging circuit comprises a resistor provided between the input of said inverting amplifier and a first power supply, and said first capacitor is charged by a current flowing through said resistor to increase an input potential of said inverting amplifier.

17. The semiconductor device according to claim 16,
wherein, when a slew rate of a decrease of a potential of the bit line determined by a discharge current of said memory cell and a parasitic capacitance of said bit line is larger than a predetermined threshold, the input potential of said inverting amplifier is decreased through said first capacitor, when the slow rate of a decrease of the potential of the bit line is smaller than said predetermined threshold, the input potential of said inverting amplifier is increased through a charge transfer from said second capacitor to said first capacitor, and according to the increase or decrease of the input potential of said inverting amplifier depending on a magnitude of the slew rate of the decrease of the potential of said bit line, the input potential of said inverting amplifier is amplified to be extended to a logic amplitude, thereby reading the stored data in said memory cell.

18. The semiconductor device of claim 12, further comprising a power supply connected to the charging circuit, the charging circuit connected to the second node of the first capacitor and supplying charge to the first capacitor from the power supply.

* * * * *